(12) United States Patent
Schumacher et al.

(10) Patent No.: US 8,915,756 B2
(45) Date of Patent: Dec. 23, 2014

(54) COMMUNICATION CONNECTOR HAVING A PRINTED CIRCUIT BOARD WITH THIN CONDUCTIVE LAYERS

(71) Applicant: CommScope, Inc. of North Carolina, Hickory, NC (US)

(72) Inventors: Richard A. Schumacher, Dallas, TX (US); Ryan E. Enge, Carrollton, TX (US); Wayne D. Larsen, Wylie, TX (US); Bryan S. Moffitt, Red Bank, NJ (US); Julian Pharney, Indianapolis, IN (US)

(73) Assignee: CommScope, Inc. of North Carolina, Hickory, NC (US)

( * ) Notice: Subject to any disclaimer, the term of this patent is extended or adjusted under 35 U.S.C. 154(b) by 55 days.

(21) Appl. No.: 13/802,844

(22) Filed: Mar. 14, 2013

(65) Prior Publication Data

US 2014/0206240 A1 Jul. 24, 2014

Related U.S. Application Data

(60) Provisional application No. 61/755,581, filed on Jan. 23, 2013.

(51) Int. Cl.
| | | |
|---|---|---|
| H01R 24/00 | (2011.01) | |
| H01R 13/6473 | (2011.01) | |
| H01R 13/6461 | (2011.01) | |
| H01R 13/6466 | (2011.01) | |
| H01R 24/64 | (2011.01) | |

(52) U.S. Cl.
CPC ........ H01R 13/6473 (2013.01); H01R 13/6461 (2013.01); H01R 13/6466 (2013.01); H01R 24/64 (2013.01)

USPC .......................................................... 439/676

(58) Field of Classification Search
CPC ............ H01R 23/005; H01R 13/6625; H01R 23/6658
USPC .......................................................... 439/676
See application file for complete search history.

(56) References Cited

U.S. PATENT DOCUMENTS

| | | | |
|---|---|---|---|
| 5,864,089 A | 1/1999 | Rainal | |
| 7,190,594 B2 * | 3/2007 | Hashim et al. | 361/777 |
| 7,252,554 B2 * | 8/2007 | Caveney et al. | 439/676 |
| 7,265,300 B2 * | 9/2007 | Adriaenssens et al. | 174/258 |
| 7,980,900 B2 * | 7/2011 | Hashim et al. | 439/676 |
| 8,047,879 B2 * | 11/2011 | Hashim | 439/676 |
| 8,235,731 B1 | 8/2012 | Poulson et al. | |
| 8,287,317 B2 * | 10/2012 | Straka et al. | 439/676 |
| 2004/0184247 A1 * | 9/2004 | Adriaenssens et al. | 361/766 |
| 2005/0254223 A1 * | 11/2005 | Hashim et al. | 361/793 |
| 2010/0190357 A1 * | 7/2010 | Hashim | 439/55 |

* cited by examiner

Primary Examiner — Chandrika Prasad
(74) Attorney, Agent, or Firm — Myers Bigel Sibley & Sajovec, P.A.

(57) ABSTRACT

Communications connectors include a housing and a printed circuit board that is at least partially mounted in the housing that has a plurality of conductive paths that are arranged in pairs to form a plurality of differential transmission lines. These connectors further include a plurality of contacts, each of which is electrically connected to a respective one of the conductive paths of the printed circuit board. The printed circuit board further includes at least a first floating image plane that is located between a top surface and a bottom surface thereof, the floating image plane being electrically isolated from the plurality of conductive paths.

21 Claims, 9 Drawing Sheets

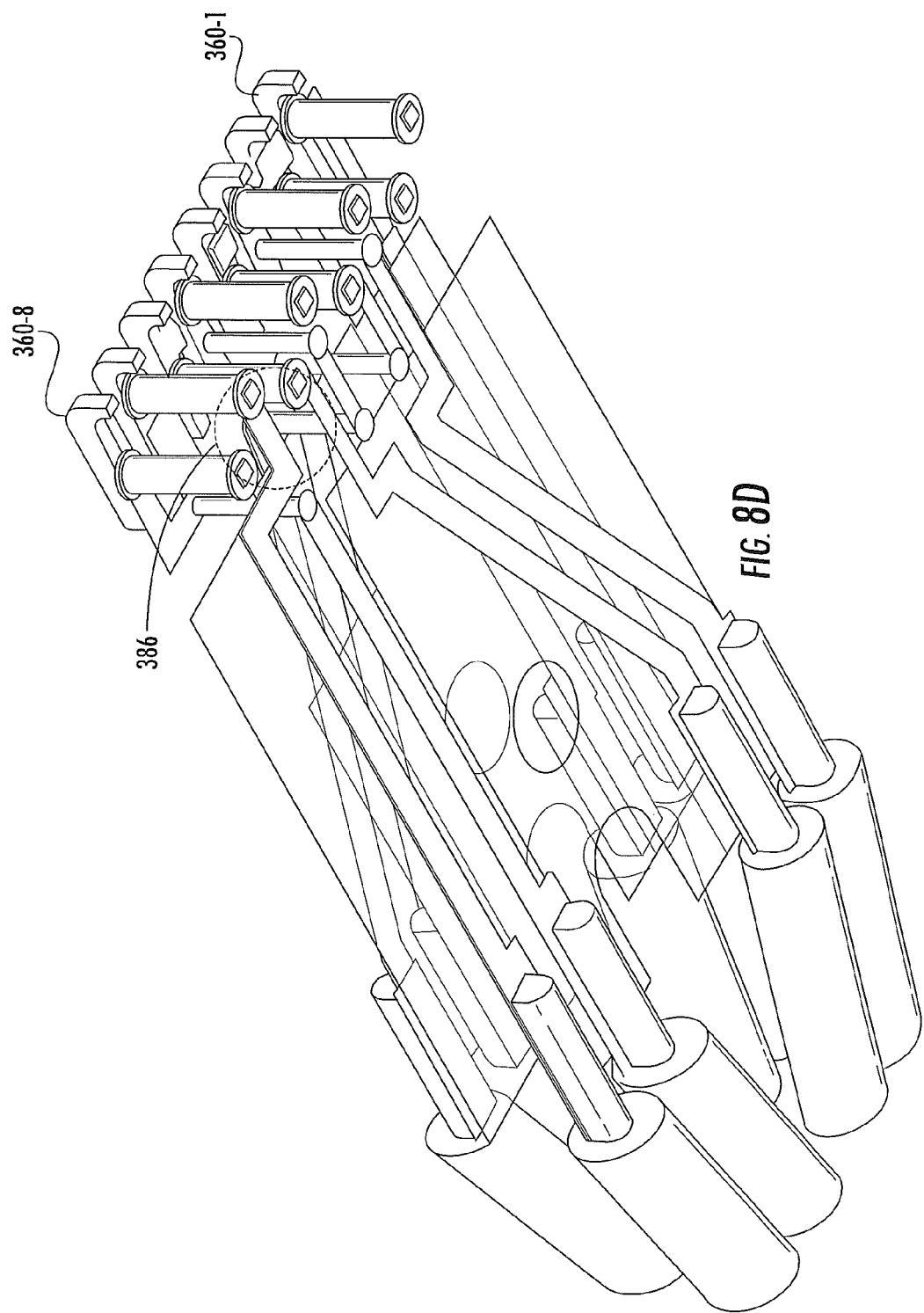

COMMUNICATION CONNECTOR HAVING A PRINTED CIRCUIT BOARD WITH THIN CONDUCTIVE LAYERS

CROSS-REFERENCE TO RELATED APPLICATION

The present application claims priority under 35 U.S.C. §§119(e) to U.S. Provisional Patent Application Ser. No. 61/755,581, filed Jan. 23, 2013, the disclosure of which is hereby incorporated herein by reference in its entirety.

FIELD OF THE INVENTION

The present invention relates generally to communications connectors and, more particularly, to communications connectors such as RJ-45 modular plugs and jacks that have printed circuit boards.

BACKGROUND

Many hardwired communications systems use plug and jack connectors to connect a communications cable to another communications cable or to computer equipment. By way of example, high speed communications systems routinely use such plug and jack connectors to connect computers, printers and other devices to local area networks and/or to external networks such as the Internet. FIG. 1 depicts a highly simplified example of such a hardwired high speed communications system that illustrates how RJ-45 plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at either end thereof. Typically, the cable 12 includes eight insulated conductors. As shown in FIG. 1, plug 14 is inserted into an opening or "plug aperture" 16 in the front side of the communications jack 15 so that the eight contacts of communications plug 14 mate with the respective eight contacts of the communications jack 15. The communications jack 15 includes a wire connection assembly 17 at the back end thereof that receives the eight conductors from a second cable 18 that are individually pressed into slots in the wire connection assembly 17 to establish mechanical and electrical connections between each conductor of the second cable 18 and a respective one of eight conductive paths through the communications jack 15. The other end of the second cable 18 is connected to a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide eight electrical paths between the computer 11 and the network server 20. These electrical paths may be used to communicate electrical information signals between the computer 11 and the network server 20.

When a signal is transmitted over a conductor (e.g., an insulated copper wire) in a communications cable, electrical noise from external sources may be picked up by the conductor, degrading the quality of the signal. In order to counteract such noise sources, the information signals in the above-described communications systems are typically transmitted between devices over a pair of conductors (hereinafter a "differential pair" or simply a "pair") rather than over a single conductor. The two conductors of each differential pair are twisted tightly together in the communications cables and patch cords so that the eight conductors are arranged as four twisted differential pairs of conductors. The signals transmitted on each conductor of a differential pair have equal magnitudes, but opposite phases, and the information signal is embedded as the voltage difference between the signals carried on the two conductors of the pair. When the signal is transmitted over a twisted differential pair of conductors, each conductor in the differential pair often picks up approximately the same amount of noise from these external sources. Because the information signal is extracted by taking the difference of the signals carried on the two conductors of the differential pair, the subtraction process may mostly cancel out the noise signal, and hence the information signal is typically not disturbed.

Referring again to FIG. 1, it can be seen that a series of plugs, jacks and cable segments connect the computer 11 to the server 20. Each plug, jack and cable segment includes four differential pairs, and thus a total of four differential communications paths are provided between the computer 11 and the server 20 that may be used to carry two way communications therebetween (e.g., two of the differential pairs may be used to carry signals from the computer 11 to the server 20, while the other two may be used to carry signals from the server 20 to the computer 11). The cascaded plugs, jacks and cabling segments shown in FIG. 1 that provide connectivity between two end devices (e.g., computer 11 and server 20) is referred to herein as a "channel." Thus, in most high speed communications systems, a "channel" includes four differential pairs. Unfortunately, the proximities of the conductors and contacting structures within each plug-jack connection (e.g., where plug 14 mates with jack 15) can produce capacitive and/or inductive couplings. These capacitive and inductive couplings in the connectors (and similar couplings that may arise in the cabling) give rise to another type of noise that is known as "crosstalk."

In particular, "crosstalk" refers to unwanted signal energy that is capacitively and/or inductively coupled onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

Crosstalk that arises between two differential pairs that are part of the same channel is typically referred to as "internal" crosstalk. Because communications cables are often bundled together for routing through the walls, floors and/or, ceilings of buildings and/or because communications connectors are often located in very close proximity to each other in, for example, patch panels and switches, crosstalk may also occur between one or more differential pairs of a first channel and one or more differential pairs of a second channel. Such crosstalk between differential pairs of different channels is typically referred to as "alien" crosstalk.

While methods are available that can significantly reduce the effects of crosstalk within communications cable segments, the communications connector configurations that were adopted years ago—and which still are in effect in order to maintain backwards compatibility—generally did not arrange the contact structures so as to minimize crosstalk between the differential pairs in the connector hardware. For example, pursuant to the ANSI/TIA-568-C.2 standard approved Aug. 11, 2009 by the Telecommunications Industry Association (also known as the Category 6a standard), in the connection region where the contacts of a modular plug mate with the contacts of the modular jack (referred to herein as the "plug-jack mating region"), the eight contacts 1-8 of the jack must be aligned in a row, with the eight contacts 1-8 arranged as four differential pairs specified as depicted in FIG. 2. As known to those of skill in the art, under the TIA/EIA 568 type B configuration, contacts 4 and 5 in FIG. 2 comprise pair 1, contacts 1 and 2 comprise pair 2, contacts 3 and 6 comprise pair 3, and contacts 7 and 8 comprise pair 4. As is apparent from FIG. 2, this arrangement of the eight contacts 1-8 will result in unequal coupling between the differential pairs, and hence both NEXT and FEXT is introduced in each connector in industry standardized communications systems.

As hardwired communications systems have moved to higher frequencies in order to support increased data rate communications, crosstalk in the plug and jack connectors has became a more significant problem. To address this problem, communications jacks now routinely include crosstalk compensation circuits that introduce compensating crosstalk that is used to cancel much of the "offending" crosstalk that is introduced in the plug-jack mating region as a result of the industry-standardized connector configurations. Typically, so-called "multi-stage" crosstalk compensation circuits are used. Such crosstalk circuits are described in U.S. Pat. No. 5,997,358 to Adriaenssens et al., the entire content of which is hereby incorporated herein by reference as if set forth fully herein.

Another important parameter in communications connectors is the return loss that is experienced along each differential pair (i.e., differential transmission line) through the connector. The return loss of a transmission line is a measure of how well the transmission line is impedance matched with a terminating device or with loads that are inserted along the transmission line. In particular, the return loss is a measure of the signal power that is lost due to signal reflections that may occur at discontinuities (impedance mismatches) in the transmission line. Like crosstalk, return loss is typically expressed as a ratio in decibels (dB) as follows:

$$RL(dB) = 10\log_{10}\frac{P_i}{P_r}$$

where RL(dB) is the return loss in dB, $P_i$ is the incident power and $P_r$ is the reflected power. High return loss values indicate a good impedance match (i.e., little signal loss due to reflection), which results in lower insertion loss values, which is desirable.

Another important parameter in such communications connectors is the balance that is experienced along each differential transmission line through the connector. The balance of a transmission line is a measure of how well the individual conductors of the transmission line are matched with each other and with their surroundings. In particular, the balance is a measure of the differential signal power that is lost due to conversion into common mode signal power that may occur in sections of mismatch in the differential transmission line. By electromagnetic reciprocity, it is also a measure of how much susceptibility the differential transmission line has to external noise sources as described above.

SUMMARY

Pursuant to embodiments of the present invention, communications connectors are provided that include a housing and a printed circuit board that is at least partially mounted in the housing that has a plurality of conductive paths that are arranged in pairs to form a plurality of differential transmission lines. These connectors further include a plurality of contacts, each of which is electrically connected to a respective one of the conductive paths of the printed circuit board. The printed circuit board further includes at least a first floating image plane that is located between a top surface and a bottom surface thereof, the floating image plane being electrically isolated from the plurality of conductive paths and from other conducting or grounding elements.

In some embodiments, the printed circuit board may further include a second floating image plane. This second floating image plane may be electrically isolated from the first floating image plane. The first floating image plane may be on a first interior layer of the printed circuit board that is adjacent the top surface thereof and the second floating image plane may be on a second interior layer that is adjacent the bottom surface thereof. The communications connector may comprise, for example, an RJ-45 jack or an RJ-45 plug. The printed circuit board may be a flexible printed circuit board in some embodiments.

In some embodiments, the conductive paths of a first of the differential transmission lines connect to the respective contacts of a first pair of the contacts and the conductive paths of a second of the differential transmission lines connect to the respective contacts of a second first pair of the contacts. Each contact includes a contact region that is designed to mate with a respective one of a plurality of contacts of a mating communications connector. The contact regions of the first pair of contacts are sandwiched between the contact regions of the second pair of contacts. The second differential transmission line may include a first section that is adjacent the second pair of contacts where the conductive paths are spaced farther apart from each other than are the conductive paths in a second section of the second differential transmission line. In such embodiments, the first floating image plane may be positioned to lower the impedance of the first section of the second differential transmission line or to raise the impedance of the second section of the second differential transmission line and allow for improving the crosstalk that would otherwise be generated in this section.

In some embodiments, the printed circuit board has a front edge, a back edge and two side edges. In these embodiments, the first floating image plane may extend closer to the first side of the printed circuit board than do any of the plurality of differential transmission lines to, for example, facilitate reducing alien crosstalk. The first floating image plane may likewise extend closer to the second side of the printed circuit board than do any of the plurality of differential transmission lines.

In some embodiments, a first of the differential transmission lines may have a first section where the pair of conductive paths are closely spaced and a second section where the pair of conductive paths are spaced farther apart than in the first section, and the first floating image plane may extend under the first section of the first of the differential transmission lines and may not extend under the second section.

In some embodiments, the first floating image plane may include at least a first gap that is configured to act as a common mode filter. In some embodiments, the communication connector may comprise a plug and may be combined with a communications cable to form a patch cord. In some embodiments, the first floating image plane may be interposed between a first differential transmission line on the top surface of the printed circuit board and a second differential transmission line on the bottom surface of the printed circuit board.

In some embodiments, either floating image plane may be positioned or shaped in a manner that is not symmetrical to the differential transmission line and the resulting dissimilar proximity can alter the balance of the transmission line in ways to compensate for other imbalances that may be present.

BRIEF DESCRIPTION OF THE DRAWINGS

FIGS. 8A-8D are various perspective views of a printed circuit board of the plug of FIG. 7.

DETAILED DESCRIPTION

Pursuant to embodiments of the present invention, communications connectors (e.g., jacks and plugs) are provided that include printed circuit boards that have one or more floating image planes embedded therein. Herein, a "floating image plane" refers to a thin conductive layer that is provided within the printed circuit board that is not electrically connected to any of the conductive signal-carrying paths through the printed circuit board, and that is not electrically grounded (or otherwise electrically connected to a reference voltage). These floating image planes may be used to reduce crosstalk between differential transmission lines that are provided on opposing layers of the printed circuit board (typically some differential transmission lines are routed along the top of the printed circuit board, while other differential transmission lines are routed along the bottom of the printed circuit board), reduce crosstalk between differential transmission lines that are provided on the same side of the printed circuit board, reduce alien crosstalk that may arise in the connector, and/or control the impedance of one or more of the differential transmission lines, which may improve return loss and insertion loss performance of the connector.

Embodiments of the present invention will now be discussed in greater detail with reference to the drawings.

Figure 3:
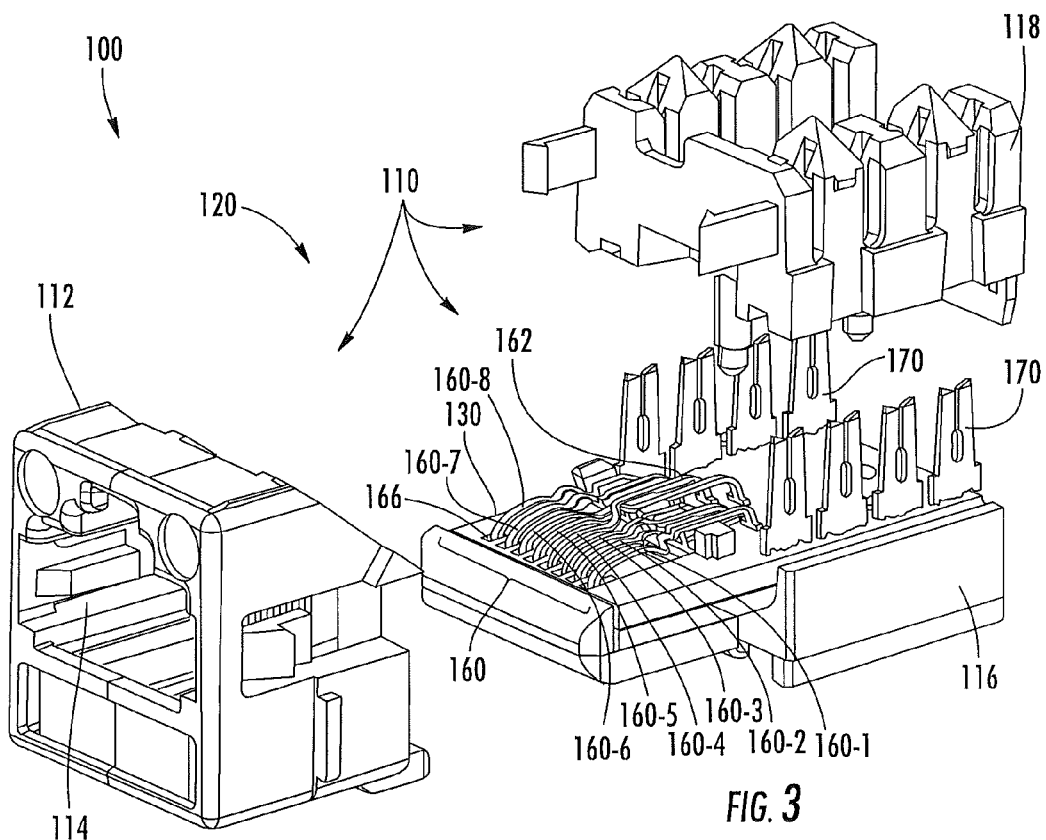
FIG. 3 is a schematic, exploded perspective view of a jack according to embodiments of the present invention.
Figure 4:
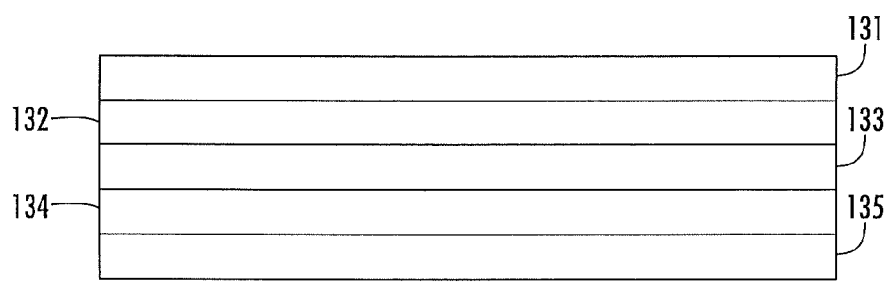
FIG. 4 is a schematic side view of a printed circuit board of the jack of FIG. 3.

FIG. 3 is a schematic perspective diagram illustrating a jack 100 according to embodiments of the present invention. FIG. 4 is a schematic side view of a printed circuit board 130 of the jack 100 of FIG. 3. FIGS. 5A-5D are schematic plan views of the individual layers of the printed circuit board 130 of FIG. 4.

As shown in FIG. 3, the jack 100 includes a housing 110. In the depicted embodiment, the housing 110 includes a jack frame 112, a cover 116 and a terminal housing 118. The jack frame 112 includes a plug aperture 114 for receiving a mating communications plug. The housing components 112, 116, 118 may be conventionally formed and need not be described in detail herein. Those skilled in this art will recognize that other configurations of jack frames, covers and terminal housings may also be employed with the present invention, and that the housing 110 may have more or less than three pieces.

The jack 100 further includes a communications insert 120. The forward portion of the communications insert 120 is received within an opening in the rear of the jack frame 112. The bottom of the communications insert 120 is protected by the cover 116, and the top of the communications insert 120 is covered and protected by the terminal housing 118. The communications insert 120 includes a printed circuit board 130, a plurality of jackwire contacts 160, and a plurality of output contacts 170, each of which will be discussed in further detail below. Herein, when the communications connectors according to embodiments of the present invention include multiple of the same components, these components may be referred to individually by their full reference numerals (e.g., jackwire contact 160-4) and may be referred to collectively by the first part of their reference numeral (e.g., the jackwire contacts 160).

Figure 1:
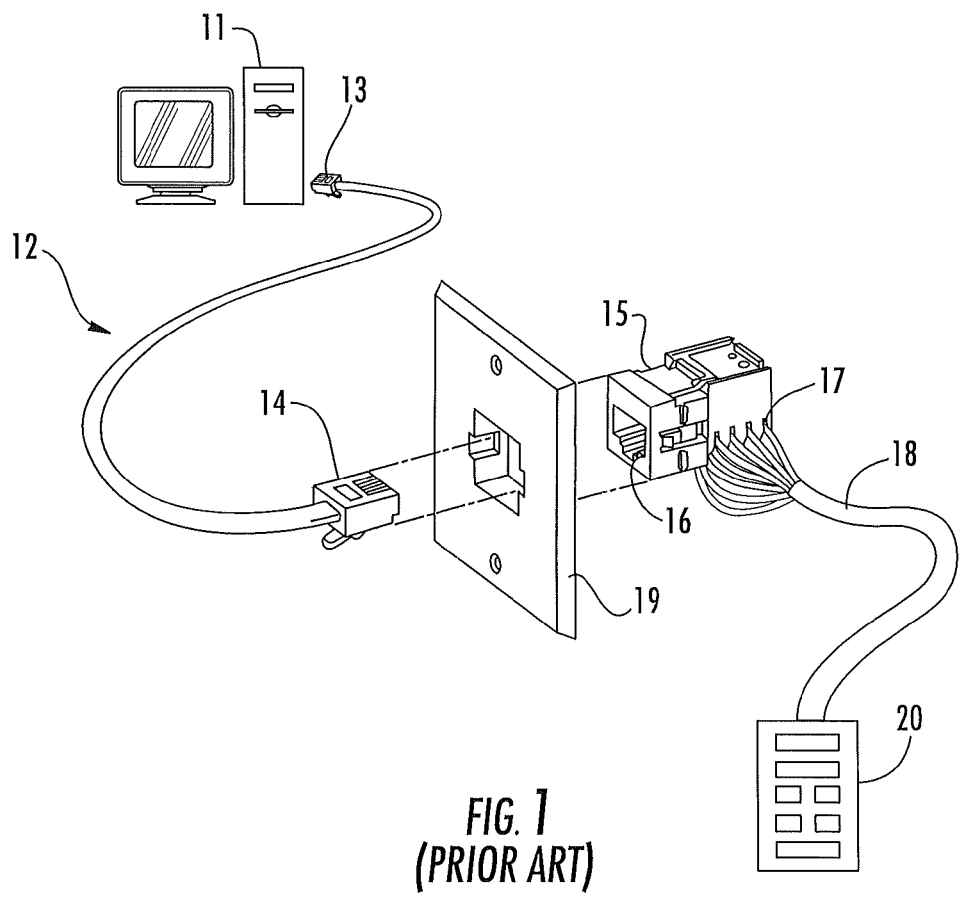
FIG. 1 is a schematic diagram illustrating the use of communications plugs and jacks to interconnect a computer with network equipment.
Figure 2:
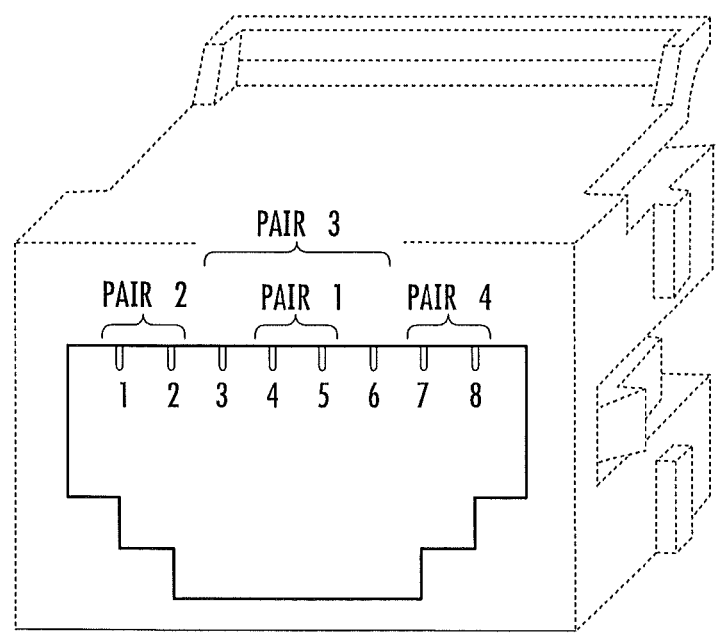
FIG. 2 is a schematic diagram illustrating the modular jack contact wiring assignments for a conventional 8-position communications jack (TIA 568B) as viewed from the front opening of the jack.

Each jackwire contact 160 has a first end 162, a second end 166 and a middle section 164. The jackwire contacts 160 may be formed of, for example, a resilient metal such as beryllium-copper or phosphor-bronze, although in some jack designs the jackwire contacts 160 may be formed of a non-resilient metal such as copper or gold-plated copper. The first end 162 of each jackwire contact 160 is mounted in a respective one of a plurality of metal-plated apertures 150-1 through 150-8 (see FIGS. 5A-5D) that are provided in the printed circuit board 130. The remainder of each jackwire contact 160 may extend into the plug aperture 114 of the jack frame 112 in a cantilevered fashion. The second, distal end 166 of each jackwire contact 160 may comprise a "free end" that floats above a top surface of the printed circuit board 130. The metal-plated apertures 150-1 through 150-8 electrically connect each jackwire contact 160 to respective conductive traces on the printed circuit board 130, as will be discussed in more detail below with reference to FIGS. 5A-5D. The middle portion 164 of each jackwire contact 160 may include a plug contact region that is designed to mate with a respective contact of a plug that is received within the plug aperture 114. The plug contact regions of the jackwire contacts 160 may be aligned in a row and arranged consistent with the T568 B standard that is discussed above with reference to FIG. 2.

As shown in FIG. 3, eight output terminals 170 are also mounted in the printed circuit board 130. In this particular embodiment, the eight output terminals 170 are implemented as insulation displacement contacts (IDCs) that are mounted in metal-plated apertures 152-1 through 152-8 (see FIGS. 5A-5D) in the printed circuit board 130. As is known to those of skill in the art, an IDC is a type of wire connection terminal that may be used to make mechanical and electrical connection to an insulated wire conductor. The IDCs 170 may be of conventional construction and need not be described in detail herein. Any other appropriate output contact may be used.

The printed circuit board 130 may include one or more dielectric layers that may have conductive traces and/or other elements disposed on one of both sides thereof, as is known to those of skill in the art. The printed circuit board 130 may be used as a transmission medium for signals that pass between the jackwire contacts 160 and the respective output contacts 170 of the jack 100, as will be explained in more detail with reference to FIGS. 5A-5D. The printed circuit board 130 may also include a plurality of crosstalk compensation circuits disposed thereon or therein, which will also be discussed in more detail below with reference to FIGS. 5A-5D.

FIG. 4 is a side schematic view of the printed circuit board 130. FIGS. 5A-5D are schematic plan views of layers 131-133 and 135, respectively, of printed circuit board 130. Layer 134 may be identical to layer 132 and hence is not separately depicted. As shown in FIG. 4, the printed circuit board 130 includes a plurality of layers 131-135. The top layer 131 and the bottom layer 135 each include a plurality of conductive traces 140 (see FIGS. 5A and 5D). These conductive traces 140, along with any layer-transferring structures such as metal-filled vias 142, may form a plurality of conductive paths 144-1 through 144-8 (see FIGS. 5A-5D). Each conductive path 144 electrically connects a respective one of the metal-plated apertures 150 to a respective one of the metal-plated apertures 152. The conductive traces 140 may be formed of conventional conductive materials such as, for example, copper, and are deposited on the printed circuit board 130 via any deposition method known to those skilled in this art.

The printed circuit board 130 may also include a plurality of crosstalk compensation circuits 148 (see FIG. 5C) such as, for example, interdigitated finger capacitors, plate capacitors, inductively coupling traces and the like. Capacitive crosstalk compensation circuits 148 are often provided on interior layers of the printed circuit board such as layer 133. However, it will be appreciated that the crosstalk compensation circuits 148 can be provided on any of the layers 131-135 of printed circuit board 130 and that some (or many) of the crosstalk compensation circuits may be implemented across multiple layers such as, for example, plate capacitor crosstalk compensation circuits. Various exemplary crosstalk compensation structures are disclosed in the above referenced '358 patent, and hence operation of these circuits will not be further discussed here.

The printed circuit board 130 may further include one or more floating image planes 154. In the depicted embodiment, the printed circuit board 130 includes two floating image planes 154, namely a first floating image plane 154-1 that is provided on layer 132 and a second floating image plane 154-2 that is provided on layer 134. The construction and operation of these floating image planes 154 will be discussed in further detail below with respect to FIG. 5B.

As shown in FIGS. 5A-5D, the metal-plated vias 150-1 through 150-8 that receive the first ends 162 of the respective jackwire contacts 160 are located in a central portion of the printed circuit board 130. The vias 150 may extend though all five layers 131-135 of the printed circuit board 130. Similarly, the metal-plated vias 152-1 through 152-8 that receive the respective output terminals (IDCs) 170 are located along the side edges of the rear portion of printed circuit board 130. The vias 152 may also extend though all five layers 131-135 of the printed circuit board 130.

The conductive paths 144-1 through 144-8 that connect the respective metal-plated vias 150-1 through 150-8 to respective ones of the metal-plated vias 152-1 through 152-8 are primarily located on layers 131 and 135 of printed circuit board 130 (i.e., the outer layers). Running these conductive paths 144 on the exterior layers 131, 135 of the printed circuit board 130 may provide for better dissipation of the heat generated by the currents running though the conductive traces 140. In this example embodiment, conductive paths 144-1 and 144-2 are entirely implemented on layer 131, and run side-by-side as a differential transmission line 146-2 across layer 131. Similarly, conductive paths 144-7 and 144-8 are implemented entirely on layer 131, and run side-by-side as a differential transmission line 146-4 across layer 131. Conductive path 144-3 is also implemented entirely on layer 131.

Conductive paths 144-4 and 144-5 are entirely implemented on layer 135, and run side-by-side as a differential transmission line 146-1 across layer 135. Conductive path 144-6 is implemented as a plurality of conductive traces 140 on both layer 131 and layer 135 along with two metal-filled vias 142 that run vertically all the way through the printed circuit board 130 to electrically connect the conductive trace segments 140. The conductive paths 144-3, 144-6 run side-by-side as a differential transmission line 146-3 across layer 131.

Two exemplary crosstalk compensation circuits 148-1, 148-2 in the form of interdigitated finger capacitors are included on layer 133 of printed circuit board 130 adjacent the metal-plated vias 150. These crosstalk compensation circuits 148 inject capacitive crosstalk compensation between conductive paths 144-3 and 144-5 (circuit 148-1) and between conductive paths 144-4 and 144-6 (circuit 148-2). These crosstalk compensation circuits 148-1, 148-2 introduce first stage crosstalk compensation between differential transmission lines 146-1 and 146-3. Two additional crosstalk compensation circuits 148-3, 148-4, which are also implemented in the form of interdigitated finger capacitors, are included on layers 133 and 135, respectively, adjacent the metal-plated vias 152. The crosstalk compensation circuits 148-3, 148-4 inject capacitive crosstalk compensation between conductive paths 144-3 and 144-4 (circuit 148-3) and between conductive paths 144-5 and 144-6 (circuit 148-4). These crosstalk compensation circuits 148-3, 148-4 introduce second stage crosstalk compensation between differential transmission lines 146-1 and 146-3. It will be appreciated that additional crosstalk compensation circuits 148 are typically provided, including circuits that inject compensating crosstalk between additional pair combinations (e.g., between differential transmission lines 146-2 and 146-3 and differential transmission lines 146-3 and 146-4), and that other types of crosstalk compensation structures 148 (e.g., inductive coupling structures, plate capacitors, etc.) are typically provided.

Figure 5A:
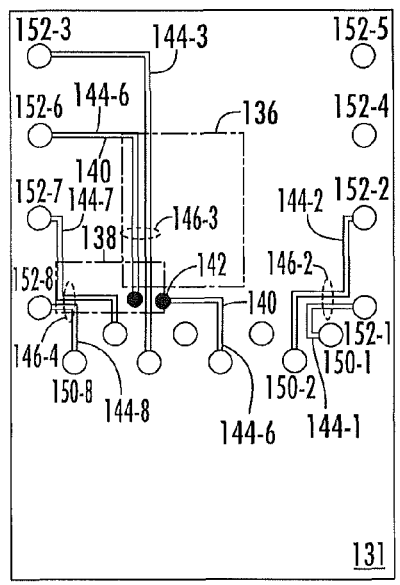
FIGS. 5A-5D are schematic plan views of the individual layers of the printed circuit board of FIG. 4.
Figure 5B:
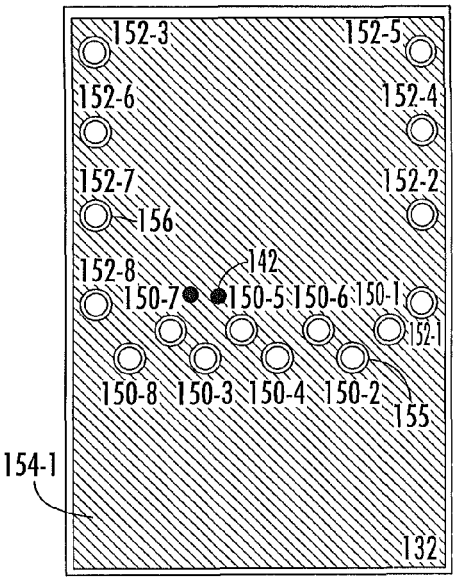
Figure 5C:
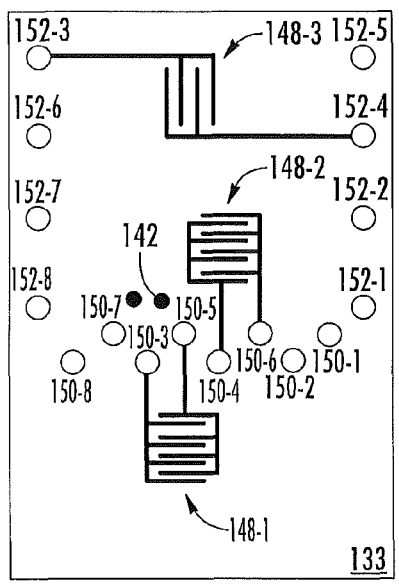
Figure 5D:
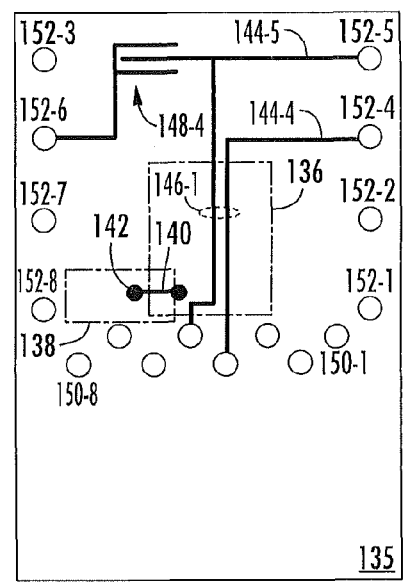

As noted above, floating image planes 154-1 and 154-2 are provided on layers 132 and 134, respectively, of printed circuit board 130. As shown in FIG. 5B, floating image plane 154-1 is implemented as a thin conductive sheet of metal (e.g., copper) that covers much of layer 132. Non-conductive islands 155 are provided that surround each metal-plated or metal-filled via 150, 152, 142 to ensure that the floating image plane 154-1 does not electrically short circuit to the conductive vias 150, 152, 142. The floating image plane 154-1 may extend almost or all the way to the front, back and side edges of the printed circuit board 130. As will be discussed in further detail below, this feature may help improve the alien crosstalk performance of the jack 100. The floating image plane 154-1 is not electrically connected to any other conductive structures on the jack 100, and is not electrically grounded or otherwise connected to a reference voltage.

Layer 134, with floating image plane 154-2 thereon, may look identical to layer 132 (see FIG. 5B), and hence is not separately depicted in the drawings. The floating image plane 154-2 is not electrically connected to any other conductive structures on the jack 100, and is, not electrically grounded or otherwise connected to a reference voltage. The voltage on the image planes is not necessarily fixed since it is isolated, but will achieve an electrical balance based on the its overall electromagnetic coupling to each of the signal lines on the adjacent layers.

The floating image planes 154-1 and 154-2 may be designed to improve the performance of communications jack 100 in one or more of several ways.

First, the floating image planes 154-1 and 154-2 may be used to reduce crosstalk between the differential transmission lines 146 that run near and/or cross each other on different layers of the printed circuit board 130. For example, in the region labeled 136 on FIGS. 5A and 5D, differential transmission lines 146-1 and 146-3 run close to each other, albeit on different layers of the printed circuit board 130. If the printed circuit board 130 is sufficiently thin (as would be the case, for example, with many flexible printed circuit boards that typically have very thin layers), significant inductive and/or capacitive coupling may occur in region 136 between differential transmission lines 146-1 and 146-3. The floating image planes 154-1 and 154-2 tend to absorb the electric fields and/or magnetic fields that emanate from the conductors of differential transmission lines 146-1 and 146-3, as electric and magnetic fields tend to terminate onto and reflect from the nearest conductive structures. Thus, in effect, the floating image planes 154-1 and 154-2 may reduce the fields of the differential transmission lines 146-1 and 146-3 and hence reduce the amount that these fields will couple onto other differential transmission lines 146 on printed circuit board 130. As a result, crosstalk between differential transmission lines 146-1 and 146-3 may be reduced, and the jack 100 may exhibit improved internal crosstalk performance as compared to conventional communications jacks. It will be appreciated that similar improvements in internal crosstalk performance may be achieved between additional pairs of differential transmission lines 146.

The floating image planes 154-1 and 154-2 may also reduce crosstalk between the differential transmission lines 146 that run near each other on the same layer of the printed circuit board 130. For example, in the region labeled 138 on FIG. 5A of printed circuit board 130, differential transmission lines 146-3 and 146-4 run close to each other as is necessary to mate with their respective metal-plated vias 150. As such, inductive and/or capacitive coupling may occur in region 138 between differential transmission lines 146-3 and 146-4. Here, the floating image plane 154-1 may be positioned a very short distance under layer 131, and hence it will tend to absorb the electric fields and/or magnetic fields that emanate from the conductors of differential transmission lines 146-3 and 146-4. In this manner, the floating image plane 154-1 may reduce the fields of the differential transmission lines 146-3 and 146-3 and hence reduce the amount of crosstalk coupling between differential transmission lines 146-3 and 146-4. It will be appreciated that similar improvements in internal crosstalk performance may be achieved between additional pairs of differential transmission lines 146.

The floating image planes 154-1 and 154-2 may also reduce crosstalk between the differential transmission lines 146 by allowing for increased physical isolation between the differential transmission lines 146. In particular, communications connectors such as jack 100 are often quite small, and hence the printed circuit boards of such connectors may also be quite small, which may place various of the differential transmission lines 146 in close proximity to each other. This close physical relationship may result in crosstalk. However, by providing one or more floating image planes 154 in the printed circuit board 130, the size of the traces (e.g., the width of the traces and/or the thickness of the traces may be made smaller (e.g., narrower and/or thinner) while still maintaining the differential transmission lines at a desired impedance level (e.g., 100 ohms). These small physical traces may exhibit less crosstalk between adjacent differential transmission lines 146.

The floating image planes 154-1 and 154-2 may also be used to improve the alien crosstalk performance of communications jack 100. As is known to those of skill in the art, communications jacks are often aligned very closely in a side-by-side manner in patch panels and wall jacks. Alien crosstalk may arise between adjacent jacks as signal energy from one or more channels in a first jack couples to one or more channels in an adjacent jack. As noted above, the floating image planes 154-1, 154-2 can suppress the fields of the differential transmission lines 146 that cross the printed circuit board 130, thereby reducing alien crosstalk between adjacent jacks. In some embodiments, the floating image planes 154-1, 154-2 may extend closer to the side edges of the printed circuit board 130 than do the differential transmission lines 146. This may increase the extent to which the floating image planes 154-1, 154-2 suppress alien crosstalk. For example, as shown in FIGS. 5A-5D, the floating image plane 154-1 extends closer to the front, back and side edges of the printed circuit board 130 than do any of the differential transmission lines 146.

The floating image planes 154-1, 154-2 may also be used to better control the impedance of the differential transmission lines 146. In particular, the floating image planes may be used to carefully control the impedance of the differential transmission lines as the impedance may be a function of the separation between the conductive traces used to form the differential transmission lines, the height and width of the conductive traces, the dielectric materials surrounding the conductive traces, and the distance between the conductive traces and the floating image plane. In connectors where the amount of room on a printed circuit board thereof is limited, floating image planes may be used to reduce the distance between the conductive traces of a differential transmission line while maintaining the transmission line at a desired impedance such as, for example, an impedance of 100 ohms. By controlling the impedance of a differential transmission line improved return loss and/or insertion loss performance may be obtained.

Figure 6:
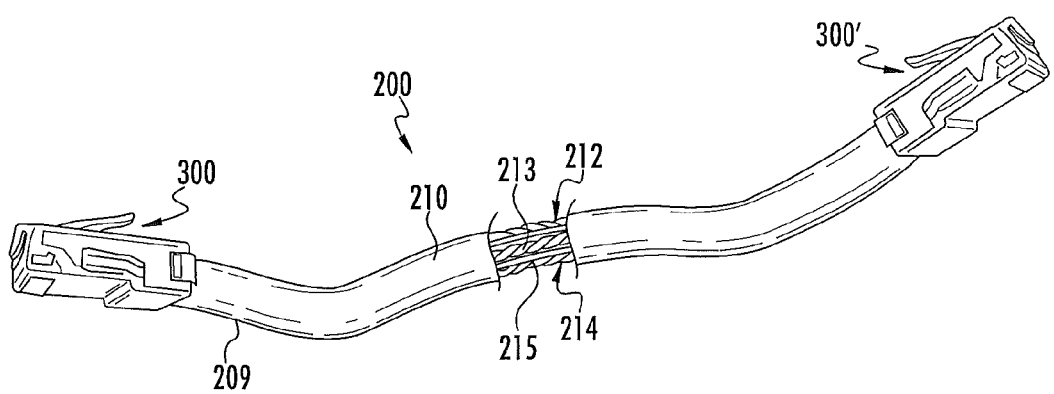
FIG. 6 is a perspective view of a patch cord according to certain embodiments of the present invention.
Figure 7:
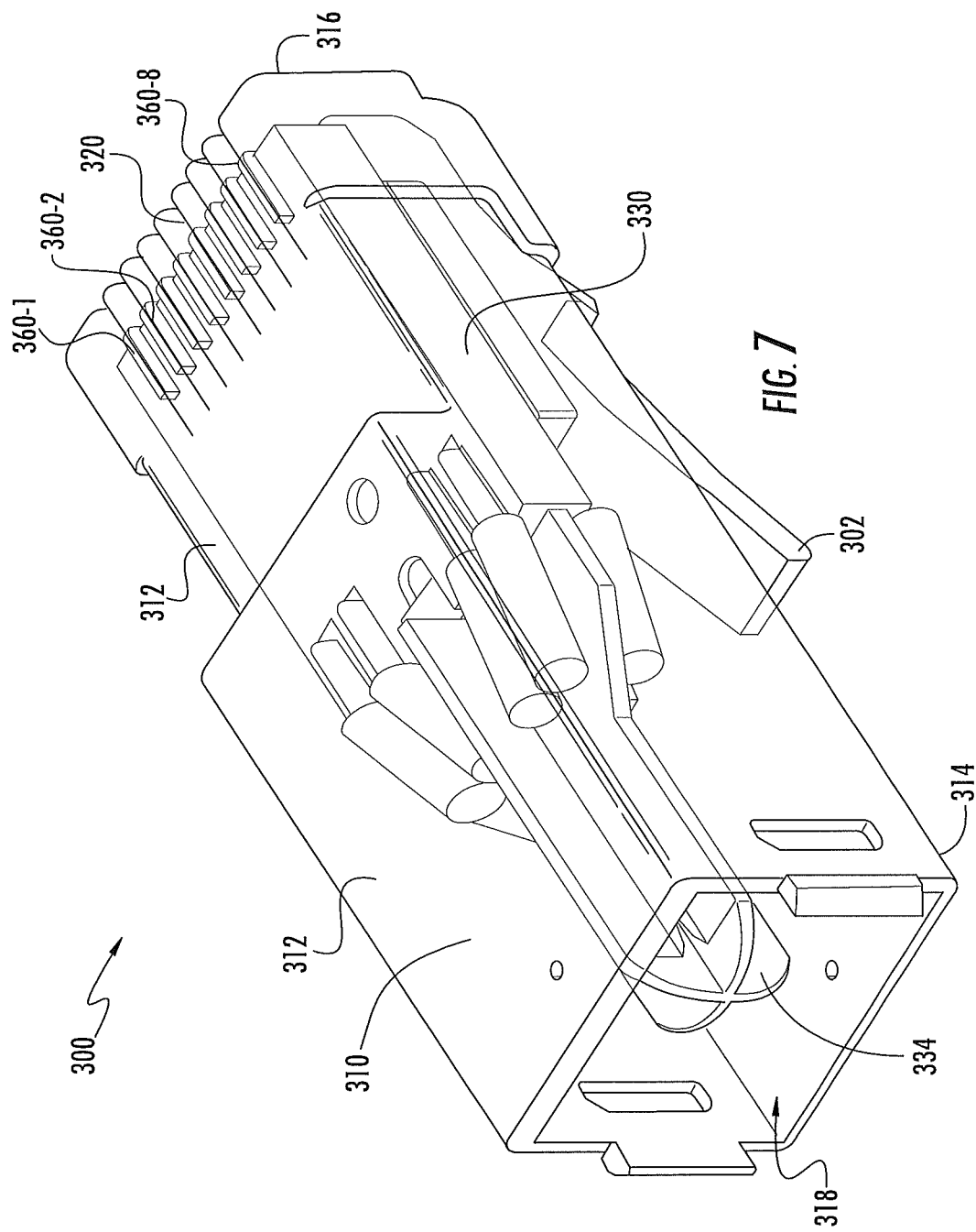
FIG. 7 is a top, rear perspective view of a plug that is included on the patch cord of FIG. 6.
Figure 8A:
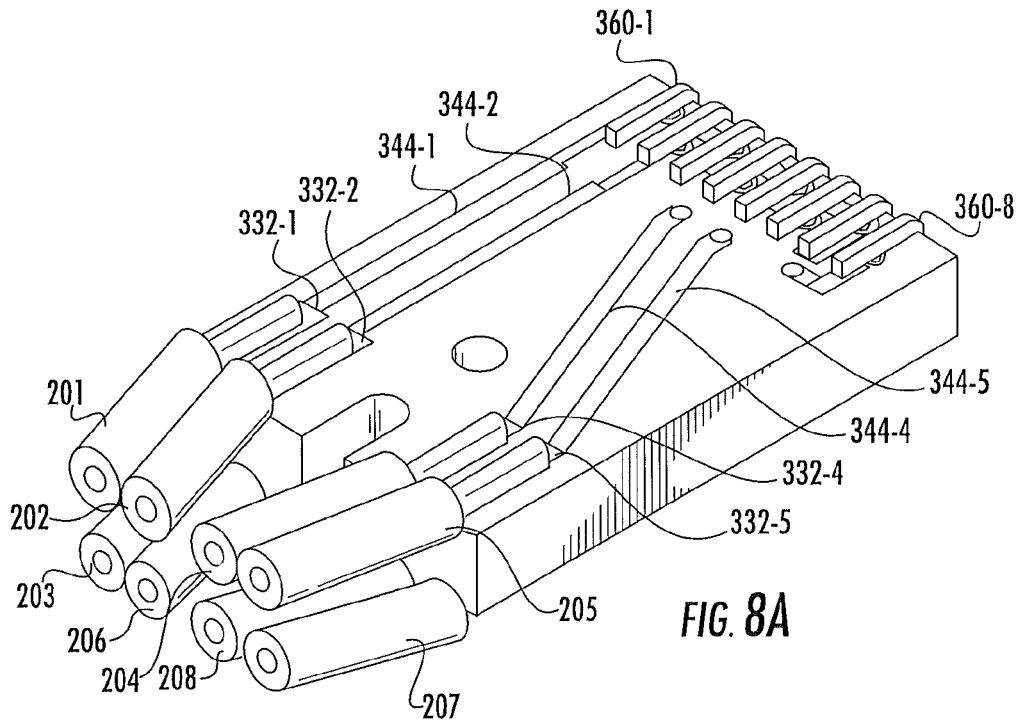
Figure 8B:
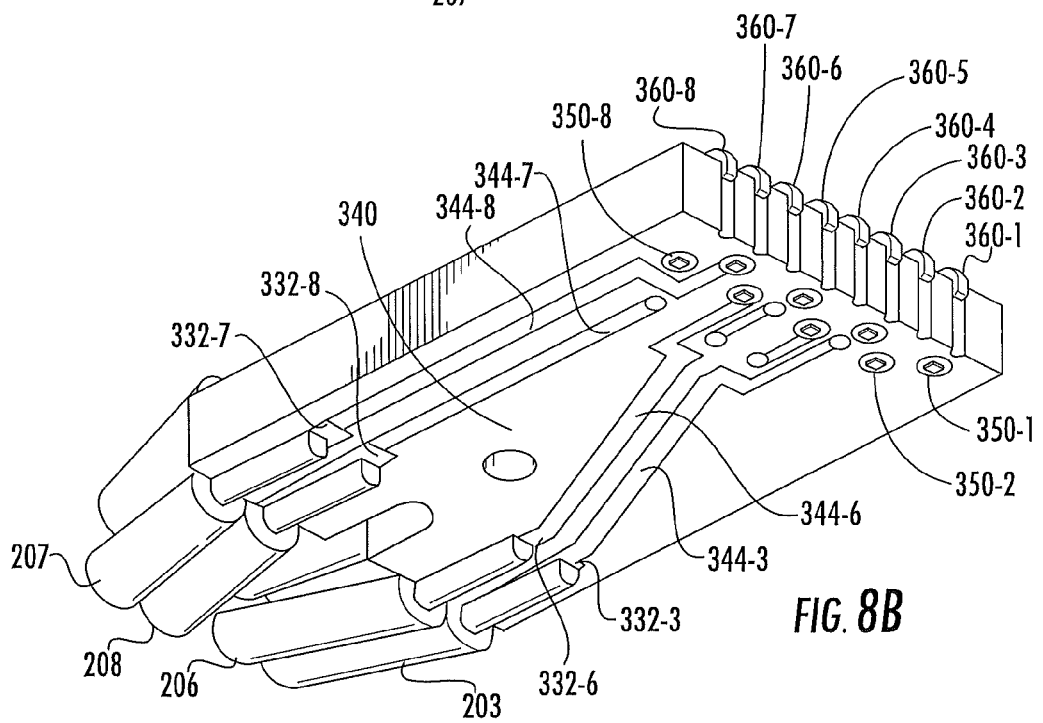
Figure 8C:
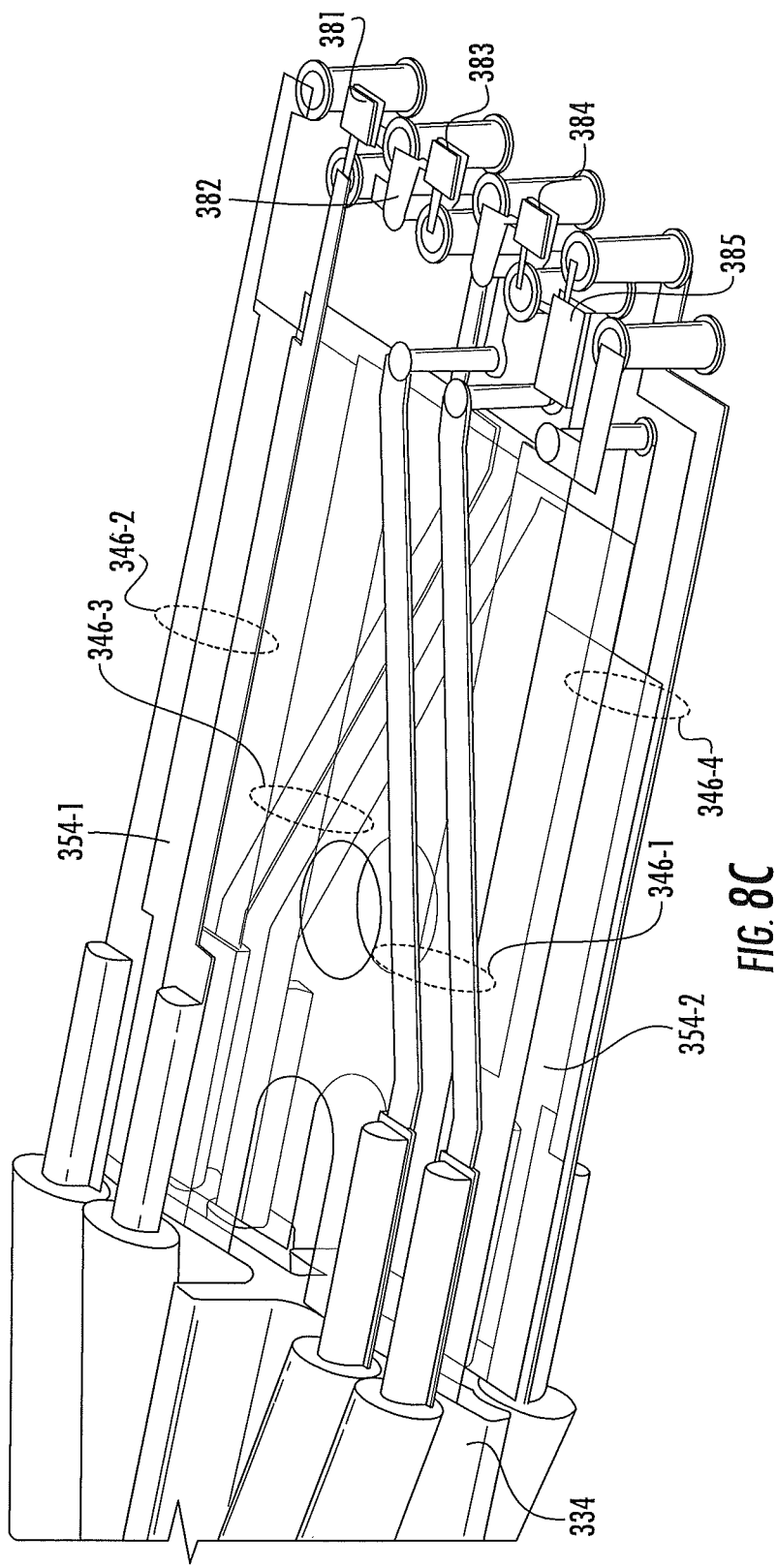

The above-described floating image planes may also be used in other types of communications connectors such as, for example, in RJ-45 communications plugs. FIGS. 6-8 illustrate an example of an RJ-45 communications plug that includes a printed circuit board having one or more floating image planes. In particular, FIG. 6 is a perspective view of a patch cord 200 according to certain embodiments of the present invention. FIG. 7 is a top-rear perspective view of a plug 300 that is included on the patch cord 200 of FIG. 6, FIGS. 8A-8D are perspective views of a printed circuit board 330 of the plug 300 of FIG. 7.

As shown in FIG. 6, the patch cord 200 includes a cable 209 that has eight insulated conductors 201-208, which may be insulated copper wires, enclosed in a jacket 210 (the conductors 201-208 are not individually numbered in FIG. 6 to simplify the drawing, and conductors 204 and 205 are not visible in FIG. 6). The insulated conductors 201-208 are arranged as four twisted pairs of conductors 211-214 (pair 211 is not visible in FIG. 6), with conductors 204 and 205 twisted together to form twisted pair 211, conductors 201 and 202 twisted together to form twisted pair 212, conductors 203 and 206 twisted together to form twisted pair 213, and conductors 207 and 208 twisted together to form twisted pair 214. A separator 215 such as a tape separator or a cruciform separator may be provided that separates one or more of the twisted pairs 211-214 from one or more of the other twisted pairs 211-214. A first plug 300 is attached to a first end of the cable 209 and a second plug 300' is attached to the second end of the cable 209 to form the patch cord 200. Strain relief boots (not shown) may be attached to each of the plugs 300, 300'. These strain relief boots may resist the tendency for a longitudinal force applied to the cable 209 to pull the cable 209 out of the plugs 300, 300'.

Turning to FIG. 7, the communications plug 300 has a housing 310 that has a bi-level top face 312, a bottom face 314, a front face 316, and a rear opening 318 that receives a rear cap of the plug housing (not shown). The plug 300 may also include various wire grooming and wire retention mechanisms, which are also omitted to simplify the drawing. A plug latch 302 extends from the bottom face 314. The top and front faces 312, 316 of the housing 310 include a plurality of longitudinally extending slots 320. The communications cable 209 (see FIG. 6) is received through the rear opening 318. The communications cable 209 extends through a cable aperture in the rear cap (which is not shown), and the rear cap is locked into place over the rear opening 318 of housing 310 after the communications cable 209 has been inserted therein. A cruciform separator 334 may be included in the rear portion of the housing 310.

As is also shown in FIG. 7, the communications plug 300 further includes a printed circuit board 330 which is disposed within the housing 310, and a plurality of plug contacts 360-1 through 360-8 (which are implemented as low-profile plug blades) that are mounted at the forward edge of the printed circuit board 330 so that the blades 360-1 through 360-8 can be accessed through the slots 320 in the top face 312 and front face 316 of the housing 310. The housing 310 may be made of a suitable insulative plastic material such as, for example, polycarbonate, ABS, ABS/polycarbonate blend or other dielectric molded materials. Any conventional housing 310 may be used. A cruciform separator 334 may be included in the rear portion of the housing 310.

FIGS. 8A and 8B are enlarged perspective top and bottom views, respectively, of the printed circuit board 330 and the plug blades 360-1 through 360-8 that illustrate these structures in greater detail and that show how the insulated conductors 201-208 of communications cable 209 are electrically connected to the respective plug blades 360-1 through 360-8 through the printed circuit board 330. FIGS. 8C and 8D are enlarged perspective top and bottom views, respectively, of the top and bottom surfaces of the printed circuit board 330. In FIGS. 8C and 8D, the dielectric layers of the printed circuit board 330 are omitted in order to better illustrate a pair of floating image planes 354-1, 354-2 that are included on interior layers of the printed circuit board 330.

The printed circuit board 330 may comprise, for example, a conventional printed circuit board, a specialized printed circuit board (e.g., a flexible printed circuit board) or any other appropriate type of wiring board, all of which are generically referred to herein as a "printed circuit board." In the embodiment of the present invention depicted in FIGS. 7-8, the printed circuit board 330 comprises a conventional multi-layer printed circuit board.

As shown in FIGS. 8A and 8B, the printed circuit board 330 includes four plated pads 332-1, 332-2, 332-4, 332-5 on a top surface thereof and an additional four plated pads 332-3, 332-6, 332-7, 332-8 on a bottom surface thereof. The insulation is removed from an end portion of each of the conductors 201-208 of the communications cable 209, and the metal core of each conductor 201-208 may be soldered, welded or otherwise attached to a respective one of the plated pads 332-1 through 332-8. Any other suitable technique may alternatively be used for terminating the conductors 201-208 to the printed circuit board 330 (e.g., insulation piercing contacts, or insulation displacement contacts, etc.). It will be appreciated that in other embodiments all of the conductors 201-208 may be mounted exclusively on the bottom surface of the printed circuit board 330 or exclusively on the top surface of the printed circuit board 330.

As is best shown in FIGS. 8A-8C, the conductors 201-208 may be maintained in pairs within the plug 300. The cruciform separator 334 separates each pair 211-214 from the other pairs 211-214 in the cable 209 to reduce crosstalk in the plug 300. The conductors 201-208 of each pair 211-214 may be maintained as a twisted pair all of the way up to the printed circuit board 330.

The plug blades 360-1 through 360-8 are mounted at the front portion of the printed circuit board 330 to make mechanical and electrical contact with respective contacts of a mating communications jack. The plug blades 360-1 through 360-8 may be substantially transversely aligned in side-by-side relationship. Each of the plug blades 360-1 through 360-8 includes a first section that extends forwardly along a top surface of the printed circuit board 330, a transition section that curves through an angle of approximately ninety degrees and a second section that extends downwardly along the front edge of the printed circuit board 330.

Each of the plug blades 360-1 through 360-8 may be fabricated separately from the printed circuit board 330. In the depicted embodiment, each of the plug blades 360-1 through 360-8 comprise, for example, an elongated metal strip having a length of approximately 140 mils, a width of approximately 20 mils and a height (i.e., a thickness) of approximately 20 mils. Each plug blade 360 may have downwardly extending base column that is received in a respective metal-plated via 350 in the printed circuit board 330.

Turning again to FIGS. 8A-8D it can be seen that a plurality of conductive traces are provided on the top and bottom surfaces of the printed circuit board 330 that, along with metal-filled vias 342, form eight conductive paths 344-1 through 344-8 across the printed circuit board 330. The conductive paths 344 each electrically connect one of the plated pads 332 to a respective one of the metal-plated vias 350 so as to provide an electrical path between each of the conductors 201-208 of the patch cord 200 to a respective one of the plug blades 360. The eight conductive paths 344-1 through 344-8 form four differential transmission lines 346-1 through 346-4.

As shown in FIGS. 8A-8D, the two conductive paths 344 that form each of the differential transmission lines 346 are generally routed together, side-by-side, on the printed circuit board 330 in order to maintain the impedance of each differential transmission line 346 at a desired value.

In some embodiments, the plug blades 360 may not couple sufficiently to meet the offending crosstalk levels required by various industry standards such as the aforementioned ANSI/TIA-568-C.2 standard. In such embodiments, a plurality of offending crosstalk circuits may also be included, for example, on the printed circuit board 330. In the depicted embodiment, five offending crosstalk capacitors 381-385 are provided adjacent the plug blades 360, as are a number of inductive coupling sections. One such inductive coupling section 386 is labeled in FIG. 8D. However, these offending crosstalk circuits 381-386 appear as loads along each of the transmission lines 346, which may make it more difficult for the plug 300 to meet target return loss performance specifications, particularly at higher frequencies.

A first floating image plane 354-1 is provided underneath the top layer of printed circuit board 330, and a second floating image plane 354-2 is provided above the bottom layer of printed circuit board 330. The floating image planes 354-1, 354-2 may reduce internal crosstalk and alien crosstalk in the same manner, discussed above, that the floating image planes 154-1, 154-2 do in the communications jack 100. The floating image planes 354-1, 354-2 may also be used to control the impedance of the differential transmission lines 346, and may allow the conductive paths 344 of the differential transmission lines 346 to be more closely spaced together. This allows greater separation between the differential transmission lines 346 (the ability to space the differential transmission lines 346 is limited due to the small size of the plug 300), thereby further reducing the internal crosstalk.

Additionally, the floating image planes 354-1, 354-2 may be used to create impedance discontinuities along one or more of the differential transmission lines 346. In particular, as explained in detail in U.S. Provisional Patent Application Ser. No. 61/755,581, filed Jan. 23, 2013, the entire contents of which is incorporated herein by reference, impedance discontinuities may be intentionally included in communications connectors in order to improve the return loss and/or the insertion loss along the differential transmission lines that carry signals through the connectors. These impedance discontinuities may be used to create resonances at one or more frequencies (typically outside the operating frequency range of the connector). These resonances may be tuned to enhance the return loss and/or the insertion loss of the differential transmission line within a desired range of frequencies without unacceptably degrading other characteristics of the differential transmission line.

Referring to FIGS. 8C-8D, it can be seen that the floating image planes 354-1, 354-2 do not extend all of the way to the front of the printed circuit board 330. As noted above, the printed circuit board 330 may be designed so that the floating image plane 354-1 impacts the impedance of differential transmission lines 346-1 and 346-2, and the floating image plane 354-2 impacts the impedance of differential transmission lines 346-3 and 346-4. As such, the impedance of all four transmission lines 346 change as they pass from the back portion of the printed circuit board 330 (where the floating image planes 354-1, 354-2 are provided) to the front of the printed circuit board 330 (where no floating image planes are provided). In other embodiments, the impedance mismatches may be created by varying the distance of the conductors that form the differential transmission lines 346 from one or more of the image planes 354-1, 354-2. For example, in other embodiments, part of floating image plane 354-1 could be implemented on a first layer of the printed circuit board 330 and another portion of the floating image plane 354-1 could be implemented on a second (different) layer of the printed circuit board 330 in order to create impedance mismatches along one or more of the differential transmission lines 346 by varying the distance between a first segment of the transmission line 346 and the floating image plane 354-1 and a second segment of the transmission line 346 and the floating image plane 354-1.

As is shown best in FIG. 8D, the conductive paths 344-3, 344-6 that form differential transmission line 346-3 run side-by-side close together across most of the bottom surface of printed circuit board 330, but then split farther apart near the front edge of printed circuit board 330. This increase in the distance between the conductive paths may increase the impedance of this portion of the differential transmission line 346-3. As shown best in FIG. 8D, the floating image plane 154-2 may extend farther forward toward the front of printed circuit board 330 in order to lower the impedance of the portion of differential transmission line 346-3 where the conductive paths split farther apart. Additionally, as this portion of transmission line 346-3 is more susceptible to crosstalk (as the conductive paths are farther apart, and hence experience greater variation in the coupling of a noise source onto the two paths), extending the floating image plane 354-2 over the section of transmission line 346-3 where the conductive paths split apart may also help reduce the crosstalk, as the floating image plane 354-2 will constrain at least some of the signal energy that would otherwise appear as crosstalk. Thus it can be seen that the floating image plane provides an additional means for adjusting many of the differential transmission parameters.

Pursuant to further embodiments of the present invention, communications connectors may be provided which have a printed circuit board that includes one or more floating image planes that act as a common mode filter. In particular, in many communications systems, both differential-to-differential crosstalk and differential-to-common mode crosstalk may impact performance of a plurality of closely-spaced communications channels. Common mode-to-common mode crosstalk may also impact the performance of a communications system. In such systems, it may therefore be necessary to control both the impedance of a differential transmission line and to also control the common mode impedance of the transmission line, as well as controlling the common mode coupling between different transmission lines.

In embodiments of the present invention, one or more discontinuities may be provided in a floating image plane that is provided in an interior layer of a printed circuit board. These discontinuities may be provided underneath differential transmission lines that are provided on other layers of the printed circuit board. The image plane and these discontinuities have a tendency to change how common mode signals are carried on the differential transmission lines without substantially impacting the return loss of differential signals that are carried by the differential transmission lines. Thus, each discontinuity can act as a common mode filter that can attenuate and redirect common mode signals without substantially attenuating differential signals (or, at least not attenuating them to a degree that becomes problematic). Thus, by including floating image planes that have one or more gaps therein it may be possible to adjust both the differential impedance and the common mode impedance of a transmission line to a desired value.

Figure 9:
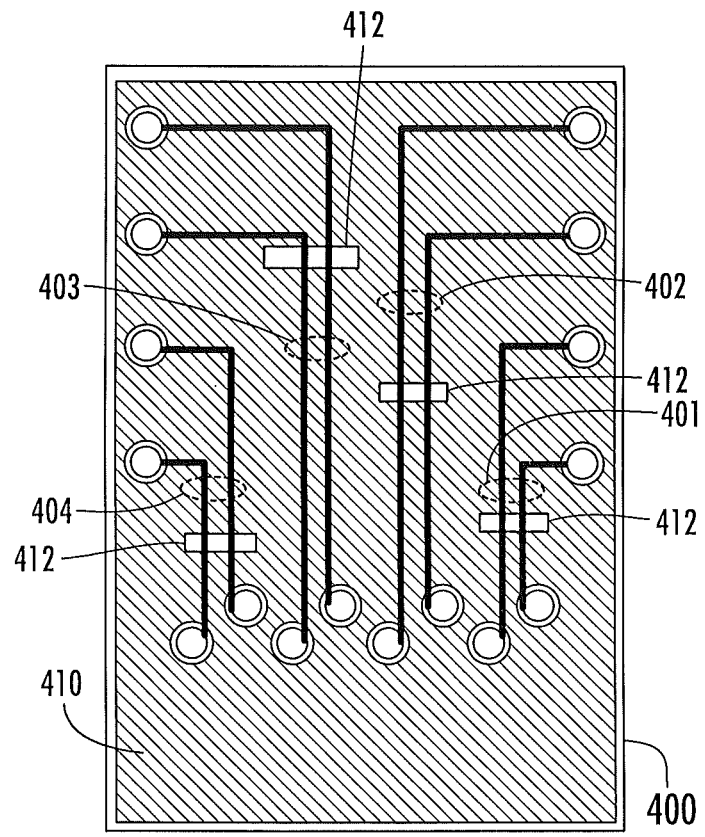
FIG. 9 is a schematic plan view of a multi-layer printed circuit board for a communications connector that includes a plurality of differential transmission lines.

By way of example, FIG. 9 is a schematic plan view of a multi-layer printed circuit board 400 for a communications connector that includes a plurality of differential transmission lines 401-404. A floating image plane 410 is provided on a layer underneath the differential transmission lines 401-404. As shown in FIG. 9, one or more discontinuities or gaps 412 may be provided in the floating image plane 410 underneath the transmission lines 401-404. These gaps in the floating image plane may result in abrupt changes in the common mode impedance of the differential transmission lines 401-404 that tend to reflect common mode signals, without significantly impacting the differential impedance of the transmission lines.

As mentioned earlier, imbalance of differential transmission lines may result in conversion of signals from differential to common mode and is generally detrimental to proper operation of a differential transmission line. Generally speaking, for a differential transmission line that extends on a single layer of a printed circuit board, proper balance would typically be maintained by positioning the floating image plane so that its relationship and coupling to each of the conductors of the differential transmission lines 401-404 are substantially similar in level. Thus the image plane 410 extends broadly across the printed circuit board 400 and the gaps 412 in the image plane 410 are evenly centered across the two conductors of each differential transmission line 401-404. However if a differential transmission line 401-404 is already unbalanced for other reasons such as imbalances in the jackwire contacts 160 or the IDCs 170, this effect can be used in an opposite way. In particular, the image plane can be cut away or reduced so that it is biased to couple stronger to one or the other conductor of a pair providing an opposing imbalance that can compensate for the other imbalance, and thus additionally improve transmission quality.

While the above embodiments of the present invention use floating image planes that are not electrically grounded, it will be appreciated that in other embodiments the image planes may be electrically connected to earth ground or to another reference voltage to provide grounded image planes. In unshielded twisted pair ("UTP") systems, the use of floating image planes may be preferred in some embodiments as there will typically be no reference voltage source that is conveniently available to the printed circuit board, and hence electrically connecting the image planes to a ground reference may add expense, complicate the design, or have other disadvantages. While these disadvantages may also be present in some shielded twist pair ("FTP") systems, a ground reference may be more readily available to the printed circuit board, and hence it may not be overly difficult to ground the mage planes. In some situations, grounded image planes may also provide improved performance.

Figure 10:
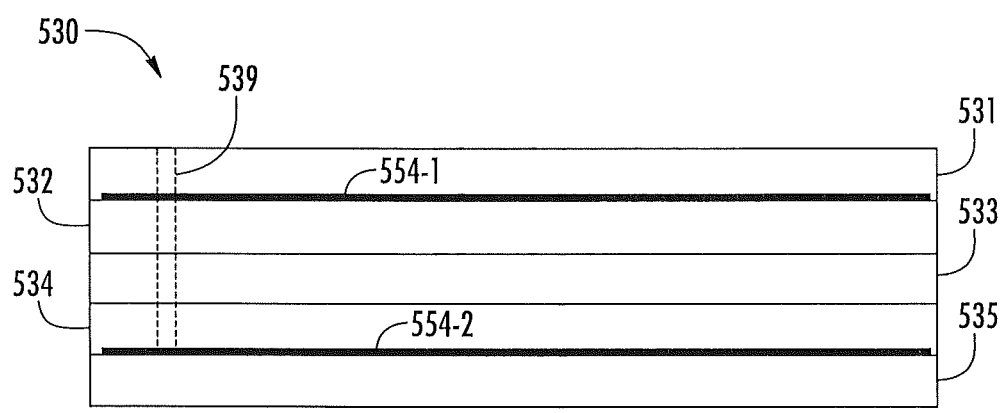
FIG. 10 is a schematic side view of a multi-layer printed circuit board for a communications connector that includes a pair of grounded image planes.

FIG. 10 is a schematic side view of a multi-layer printed circuit board 530 for a communications connector that includes a pair of grounded image planes. The printed circuit board 530 may be identical to the printed circuit board 130 of jack 100, except that the printed circuit board 530 may include a ground connection that is used to ground the two image planes included therein, as will be discussed in more detail below. The printed circuit board 530 may be used in the jack 100 in place of the printed circuit board 130.

In particular, as shown in FIG. 10, the multi-layer printed circuit board 530 includes five layers 531-535. These layers 531-535 may correspond to layers 131-135 of the printed circuit board 130 described above with reference to FIGS. 3-5. The printed circuit board 530 includes a first image plane 554-1 on layer 532 and a second image plane 554-2 on layer 534, which may be identical to the image planes 154-1, 154-2 that are described above. Additionally, the printed circuit board 530 may include a ground connection 539. This ground connection 539 may comprise, for example, a conductive via that extends through the printed circuit board 530. The conductive via 539 may receive, for example, a ground/drain wire of a communications cable that is terminated into the output terminals of jack 100. The ground connection 539 may be electrically connected to both the first and second image planes 554-1, 554-2 so that these image planes are grounded image planes. It will be appreciated that the image planes 354-1, 354-2 of communications plug 300 may be similarly converted to grounded image planes using a ground connection such as ground connection 539. In embodiments of plug 300 that use such grounded image planes, the ground connection may comprise, for example, a conductive hole in the printed circuit board 330 that receives a ground reference and that is electrically connected to the image planes 354-1, 354-2. This conductive hole 539 may be located anywhere on the printed circuit board 530 so long as it is electrically isolated from the differential transmission lines.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector comprising:
    a housing;
    a printed circuit board that has a top surface, a bottom surface and a plurality of conductive paths that are arranged in pairs to form a plurality of differential transmission lines, the printed circuit board being at least partially mounted in the housing;
    a plurality of contacts, where each of the contacts is electrically connected to a respective one of the conductive paths of the printed circuit board,
    wherein the printed circuit board further includes a first thin conductive layer that is located between the top surface and the bottom surface of the printed circuit board, the first thin conductive layer being electrically isolated from the plurality of conductive paths, and a second thin conductive layer that is also electrically isolated from the plurality of conductive paths, wherein the second thin conductive layer is electrically isolated from the first thin conductive layer.

2. The communications connector of claim 1, wherein the first thin conductive layer is on a first interior layer of the printed circuit board that is adjacent the top surface of the printed circuit board and the second thin conductive layer is on a second interior layer of the printed circuit board that is different from the first interior layer and that is adjacent the bottom surface of the printed circuit board.

3. The communications connector of claim 1, wherein the communications connector comprises an RJ-45 jack or the communications connector comprises an RJ-45 plug, that is combined with a communications cable to form a patch cord.

4. The communications connector of claim 1, wherein the printed circuit board is a flexible printed circuit board.

5. The communications connector of claim 1, wherein the thin conductive layer includes at least a first gap that is positioned above or below a first of the differential transmission lines and a second gap that is positioned above or below a second of the differential transmission lines.

6. The communications connector of claim 5, wherein the first gap acts as a common mode filter on the first of the differential transmission lines and wherein the second gap acts as a common mode filter on the second of the differential transmission lines.

7. The communications connector of claim 1, wherein the first thin conductive layer covers more than fifty percent of an internal layer of the printed circuit board.

8. A communications connector comprising:
a housing;
a printed circuit board that has a top surface, a bottom surface and a plurality of conductive paths that are arranged in pairs to form a plurality of differential transmission lines, the printed circuit board being at least partially mounted in the housing;
a plurality of contacts, where each of the contacts is electrically connected to a respective one of the conductive paths of the printed circuit board,
wherein the printed circuit board further includes a thin conductive layer that is located between the top surface and the bottom surface of the printed circuit board, the thin conductive layer being electrically isolated from the plurality of conductive paths,
wherein a first of the differential transmission lines includes first imbalanced region where a first of the conductive paths of the first of the differential transmission lines couples more heavily to the thin conductive layer than does a second of the conductive paths of the first of the differential transmission lines, and wherein the thin conductive layer is biased to couple more strongly to the first of the conductive paths in a second region of the first of the differential transmission lines to compensate for the first imbalanced region.

9. The communications connector of claim 8, wherein the communications connector comprises an RJ-45 jack or the communications connector comprises an RJ-45 plug, that is combined with a communications cable to form a patch cord.

10. The communications connector of claim 8, wherein the first floating image plane includes at least a first gap that is positioned above or below a first of the differential transmission lines and a second gap that is positioned above or below a second of the differential transmission lines.

11. The communications connector of claim 8, wherein the first thin conductive layer covers more than fifty percent of an internal layer of the printed circuit board.

12. A communications connector comprising:
a housing;
a printed circuit board that has a top surface, a bottom surface and a plurality of conductive paths that are arranged in pairs to form a plurality of differential transmission lines, the printed circuit board being at least partially mounted in the housing;
a plurality of contacts, where each of the contacts is electrically connected to a respective one of the conductive paths of the printed circuit board,
wherein the printed circuit board further includes a thin conductive layer that is located between the top surface and the bottom surface of the printed circuit board, the thin conductive layer being electrically isolated from the plurality of conductive paths,
wherein the conductive paths of a first of the differential transmission lines connect to the respective contacts of a first pair of the contacts and the conductive paths of a second of the differential transmission lines connect to the respective contacts of a second pair of the contacts, wherein each contact includes a contact region that is designed to mate with a respective one of a plurality of contacts of a mating communications connector, wherein the contact regions of the first pair of contacts are sandwiched between the contact regions of the second pair of contacts, and wherein the second differential transmission line includes a first section adjacent the second pair of contacts where the conductive paths are spaced farther apart from each other than are the conductive paths in a second section of the second differential transmission line, and wherein the thin conductive layer is positioned to either lower the impedance of the first section of the second differential transmission line or to raise the impedance of the second section of the second differential transmission line.

13. A communications connector comprising:
a housing;
a printed circuit board that has a top surface, a bottom surface and a plurality of conductive paths that are arranged in pairs to form a plurality of differential transmission lines, the printed circuit board being at least partially mounted in the housing,
a plurality of contacts, where each of the contacts is electrically connected to a respective one of the conductive paths of the printed circuit board,
wherein the printed circuit board further includes a thin conductive layer that is located between the top surface and the bottom surface of the printed circuit board, the thin conductive layer being electrically isolated from the plurality of conductive paths,
wherein a first of the differential transmission lines has a first section where the pair of conductive paths are closely spaced and a second section where the pair of conductive paths are spaced farther apart than in the first section, and wherein the thin conductive layer extends under the first section of the first of the differential transmission lines and substantially does not extend under the second section of the first of the differential transmission lines.

14. The communications connector of claim 13, wherein the communications connector comprises an RJ-45 jack or the communications connector comprises an RJ-45 plug, that is combined with a communications cable to form a patch cord.

15. The communications connector of claim 13, wherein the first floating image plane includes at least a first gap that is positioned above or below a first of the differential transmission lines and a second gap that is positioned above or below a second of the differential transmission lines.

16. The communications connector of claim 13, wherein the first thin conductive layer covers more than fifty percent of an internal layer of the printed circuit board.

17. An RJ-45 plug comprising:
a housing;
a printed circuit board that has a top surface, a bottom surface and a plurality of conductive paths that are arranged in pairs to form a plurality of differential transmission lines, the printed circuit board being at least partially mounted in the housing;
a plurality of plug blades, where each of the plug blades is electrically connected to a respective one of the conductive paths of the printed circuit board,
wherein the printed circuit board further includes a thin conductive layer that is located between the top surface and the bottom surface of the printed circuit board and that covers more than fifty percent of an internal layer of the printed circuit board, the thin conductive layer being electrically isolated from the plurality of conductive paths,
wherein the first conductive layer is interposed between a first differential transmission line on the top surface of the printed circuit board and a second differential transmission line on the bottom surface of the printed circuit board, the communications plug further comprising at least one offending crosstalk circuit located adjacent the plug blades that injects crosstalk between first and second of the differential transmission lines.

18. An RJ-45 communications connector comprising:
a housing;
a printed circuit board that has first through eighth input terminals that are electrically connected to respective first through eighth wires of a communications cable, first through eighth conductive paths that are electrically connected to the respective first through eighth input terminals, the first through eighth conductive paths forming first through fourth differential transmission lines, and first through eighth contacts that are electrically connected to the respective first through eighth conductive paths, the printed circuit board being at least partially mounted in the housing;
wherein the printed circuit board further includes a thin conductive layer that is electrically isolated from the first through eighth conductive paths and wherein the thin conductive layer includes first through fourth gaps that are provided either above or below respective ones of the first through fourth differential transmission lines to create impedance discontinuities along each of the first through fourth differential transmission lines.

19. The communications connector of claim 18, wherein the first through fourth gaps act as common mode filters on the respective first through fourth differential transmission lines.

20. A communications connector comprising:
a housing;
a printed circuit board that has a top surface, a bottom surface and a plurality of conductive paths that are arranged in pairs to form a plurality of differential transmission lines, the printed circuit board being at least partially mounted in the housing;
a plurality of contacts, where each of the contacts is electrically connected to a respective one of the conductive paths of the printed circuit board,
wherein the printed circuit board further includes a first thin conductive layer and a second thin conductive layer that are vertically stacked between the top surface and the bottom surface of the printed circuit board, the first and second thin conductive layers being connected to a reference voltage via a ground connection.

21. The communications connector of claim 20, wherein a first of the differential transmission lines includes an imbalanced region, and wherein the first thin conductive layer is biased to couple more strongly to a first of the conductive paths of the first differential transmission line to compensate for the imbalanced region.

* * * * *

UNITED STATES PATENT AND TRADEMARK OFFICE
CERTIFICATE OF CORRECTION

PATENT NO.        : 8,915,756 B2                                    Page 1 of 1
APPLICATION NO.   : 13/802844
DATED             : December 23, 2014
INVENTOR(S)       : Schumacher et al.

It is certified that error appears in the above-identified patent and that said Letters Patent is hereby corrected as shown below:

In the Claims:
Column 19, Claim 17, Line 26: Please correct "the first conductive layer"
to read -- the thin conductive layer --

Signed and Sealed this
Twenty-eighth Day of April, 2015

Michelle K. Lee
*Director of the United States Patent and Trademark Office*